United States Patent [19]

Haluska et al.

[11] Patent Number: 5,387,480
[45] Date of Patent: Feb. 7, 1995

[54] HIGH DIELECTRIC CONSTANT COATINGS

[75] Inventors: Loren A. Haluska; Keith W. Michael, both of Midland, Mich.

[73] Assignee: Dow Corning Corporation, Midland, Mich.

[21] Appl. No.: 103,371

[22] Filed: Aug. 9, 1993

Related U.S. Application Data

[63] Continuation-in-part of Ser. No. 28,063, Mar. 8, 1993.

[51] Int. Cl.$^6$ .................. B32B 9/00; B32B 19/00
[52] U.S. Cl. ..................... 428/698; 427/228; 427/387; 437/235; 437/238; 428/702; 528/15; 528/17; 528/18; 528/19
[58] Field of Search ............ 427/226, 228, 387; 437/235, 238; 528/15, 17, 18, 19; 428/698, 702

[56] References Cited

U.S. PATENT DOCUMENTS

| | | | | |
|---|---|---|---|---|
| 3,986,997 | 10/1976 | Clark | ............... | 428/412 X |
| 4,753,855 | 6/1988 | Haluska et al. | ............... | 427/88 X |
| 4,756,977 | 7/1988 | Haluska et al. | ............... | 428/704 |
| 4,782,112 | 11/1988 | Kondo et al. | ............... | 524/837 |
| 5,037,878 | 8/1991 | Cerles et al. | ............... | 524/588 |
| 5,100,503 | 3/1992 | Allman et al. | ............... | 156/643 |
| 5,258,334 | 11/1993 | Lantz, II | ............... | 437/238 |

FOREIGN PATENT DOCUMENTS 4-10339  1/1992  Japan .

OTHER PUBLICATIONS

Kraus, G., "Reinforcement of Elastomers", Interscience Publishers, New York, London, Sydney, p. 144.

*Primary Examiner*—Michael Lusignan
*Attorney, Agent, or Firm*—Roger E. Gobrogge

[57] ABSTRACT

Disclosed is a method of forming high dielectric constant coatings on substrates. The method comprises applying a coating of hydrogen silsesquioxane resin and a high dielectric constant filler onto a substrate and heating the coated substrate at a temperature sufficient to convert the hydrogen silsesquioxane resin to a silica containing ceramic matrix containing the filler.

17 Claims, No Drawings

HIGH DIELECTRIC CONSTANT COATINGS

This is a continuation-in-part of copending application(s) Ser. No. 08/028,063 filed on Mar. 8, 1993.

BACKGROUND OF THE INVENTION

The present invention relates to high dielectric constant coatings formed from hydrogen silsesquioxane resin and fillers. These coatings are useful, for example, in the manufacture of capacitors.

The use of hydrogen silsesquioxane derived ceramic coatings on substrates such as electronic devices is known in the art. For instance, Haluska et al. in U.S. Pat. No. 4,756,977 disclose a process for forming a silica coating on an electronic substrate wherein a solution of hydrogen silsesquioxane resin is applied to a substrate followed by heating the coated substrate in air at a temperature in the range of 200°–1000° C. This reference, however, does not describe the use of high dielectric constant fillers within the coating.

Similarly, the use of fillers within ceramic coatings is also known in the art. For instance, U.S. Pat. No. 3,986,997 describes a composition comprising an acidic dispersion of colloidal silica and hydroxylated silsesquioxane in an alcohol-water medium which can be used to apply transparent abrasion resistant coatings on a variety of substrates. The reference, however, does not describe the use of hydrogen silsesquioxane nor the use of high dielectric constant fillers on electronic substrates.

The present inventors have now discovered that high dielectric constant coatings can be formed from compositions comprising hydrogen silsesquioxane resin and fillers.

SUMMARY OF THE INVENTION

The present invention relates to a method of forming a high dielectric constant coating on a substrate and the substrate coated thereby. The method comprises first applying a composition comprising hydrogen silsesquioxane resin and a high dielectric constant filler onto the substrate. The coated substrate is then heated at a temperature sufficient to convert the composition to a ceramic coating having a high dielectric constant.

The present invention also relates to a coating composition comprising hydrogen silsesquioxane resin and a high dielectric constant filler diluted in a solvent.

DETAILED DESCRIPTION OF THE INVENTION

The present invention is based on the discovery that coatings having a high dielectric constant can be formed from compositions comprising hydrogen silsesquioxane resin and fillers. These coatings have particular utility in the manufacture of electronic devices such as capacitors, but the choice of substrates is limited only by the need for thermal and chemical stability of the substrate under the conditions used.

As used in the present invention, the expression "ceramic coating" is used to describe the hard coating obtained after heating the hydrogen silsesquioxane-filler composition. This coating contains both amorphous silica ($SiO_2$) materials as well as amorphous silica-like materials that are not fully free of residual carbon, silanol (Si—OH) and/or hydrogen (which are obtained upon heating the hydrogen silsesquioxane) and the filler materials. The expression "filler" is used to describe a finely divided solid phase which is distributed within the resin and the final ceramic coating. The expression "electronic substrate" is meant to include, but is not limited to, electronic devices or electronic circuits such as silicon based devices, gallium arsenide based devices, focal plane arrays, opto-electronic devices, photovoltaic cells and optical devices. The expression "high dielectric constant coating" is used to describe coatings having a DK at least about 8.

In the process of the present invention a high dielectric constant ceramic coating is formed on a substrate by a process which comprises applying a coating composition comprising hydrogen silsesquioxane resin and a filler onto the substrate and then heating the coated substrate at a temperature sufficient to convert the composition to a silica-containing ceramic.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (e.g., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, ally platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The fillers used herein are known ill the art for use in coatings with other polymers. These included various inorganic and organic fillers, especially inorganic fillers, in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, titanates such as potassium titanate and barium titanate, niobates such as lithium niobate and lead niobate, barium sulfate, calcium carbonate, precipitated diatomite, aluminum silicate or other silicates, pigments, phosphors, metals such as silver, aluminum and copper, wollostonite, mica, kaolin, clay, talc and the like. Also, some organic materials such as cellulose, polyamides, phenol resins and the like may be used.

The preferred fillers to be used herein are those with a high dielectric constant (e.g., at least about 8) and, thus, produce a high dielectric constant coating. These include titanate, niobate or tungstate salts of metals such as strontium, zirconium, barium, lead, lanthanium, iron, zinc, and magnesium. Specific preferred compounds include barium titanate, lead niobate, lead titanate, strontium titanate, barium strontium titanate, lead lanthanium zirconium titanate, lead zirconium titanate and lead tungstate. In addition, the high dielectric constant fillers can include oxides of various metals such as tantalum oxide, titanium oxide and niobium oxide.

The particle size and shape of the above fillers can vary over a wide range depending on factors such as the type of filler, the desired coating thickness, etc.

The amount of filler used in the present invention can also be varied over a wide range depending, for example, on the quality and electrical characteristics desired in the final coating. Generally, however, the fillers are used in an amount less than about 90 weight percent of the coating to insure that enough resin is present to bind the filler. Obviously, smaller amounts of fillers (e.g., 1–5 wt %) can also be used. A preferred amount of filler is in the range of about 5 to about 80 wt. percent of the coating.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents in the coating composition. These and other optional components are known to those skilled in the art.

According to the process of the invention, the hydrogen silsesquioxane resin, filler and any optional components are applied to the surface of a substrate. Such substrates are well known to those skilled in the art (e.g., capacitor art).

The coating according to the present invention can be applied in any manner, but a preferred method involves dissolving the hydrogen silsesquioxane resin in a solvent and dispersing the filler and any optional components therein. This dispersion is then applied to the surface of the substrate. Various facilitating measures such as stirring and/or heating may be used to dissolve or disperse the hydrogen silsesquioxane resin and filler and create a more uniform application material. Solvents which may be used include any agent or mixture of agents which will dissolve or disperse the hydrogen silsesquioxane resin and filler to form a homogenous liquid mixture without affecting the resultant coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0. 1–80 weight percent mixture, preferably 1–50 wt. percent.

If a liquid method is used, the liquid mixture comprising the hydrogen silsesquioxane resin, filler, solvent, and, any optional components is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the hydrogen silsesquioxane resin and filler coating. Any suitable means of evaporation may be used such as simple air drying by exposure to an ambient environment, by the application of a vacuum or mild heat (e.g., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means (e.g., melt coating) would also function herein and are contemplated to be within the scope of this invention.

The hydrogen silsesquioxane resin and filler coating is then typically converted to a silica-containing ceramic matrix having the filler disbursed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°-425° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (e.g., up to 500 microns). These coatings smooth the irregular surfaces of various substrates, they are relatively defect free, and they have excellent adhesive properties. In addition the coatings have high DKs which are often above 10 and frequently above 15. As such, they are particularly useful for a variety of electronic applications such as in the manufacture of capacitors.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No.4,756,977, which is incorporated herein by reference. An especially preferred coating is silicon carbide applied by the chemical vapor deposition of an organosilicon precursor. One example of such a process is described in U.S. Pat. No. 5,011,706 which is incorporated herein by reference. A second example involves the chemical vapor deposition utilizing trimethylsilane as the source gas. The most preferred coating comprises silicon carbide deposited in a non-uniform thickness such that uniform etching is difficult.

The following non-limiting examples are included so that one skilled in the art may more readily understand the invention.

EXAMPLE 1

Eccospheres TM DCT-28-27 (silica glass microballoons with a particle size range of 10–40 microns), 0.2 g, were ground in a mortar and pestle for about 20 minutes to decrease the particle size. A coating composition was then formed by mixing the ground glass, 0.7 g of Hydrogen silsesquioxane resin made by the method of Collins et al. in U.S. Pat. No. 3,615,273, and 0.012 g glycidoxypropyltrimethoxysilane and 0.36 g dodecane. The coating composition was applied to the surface of 2–3"×5" aluminum panels; one using a 3 mil applicator to apply a 2 mil coating and the second using a 4 mil applicator to apply a 3 mil coating. The coatings were allowed to dry for 1 hour at 64° C. The coated panels were then heated at 185° C. for 1 hour and at 410° C. for 45 minutes. The dielectric constant and dissipation factor for the 3 mil coating are as follows:

| Frequency | Dielectric Constant | Dissipation Factor |
| --- | --- | --- |
| 100 HZ | 2.43 | 0.106 |
| 1 KHZ | 2.21 | 0.097 |
| 10 KHZ | 2.13 | 0.019 |
| 100 KHZ | 2.08 | 0.009 |

The spheres had a dielectric constant =1.17 (1–8.6 GHZ) and dissipation factor =0.001 (1–8.6 GHZ).

EXAMPLE 2

A coating composition was formed by mixing 0.12 g Eccospheres SDT-28-27 (not crushed), 0.12 g 5 micron Minusil (silica), 0.7 g of Hydrogen silsesquioxane resin made by tile method of Collins et al. in U.S. Pat. No. 3,615,273, 0.012 g glycidoxypropyltrimethoxysilane and 0.456 g dodecane. The coating composition was applied to the surface of various substrates and processed as set out in the following table:

| Substrate | Film Applicator | Air Dry | 185° C. | 410° C. | Thickness (micron) |
| --- | --- | --- | --- | --- | --- |
| 3" × 6" Al Panel | 3 mil | 3 hr | 1.75 hr | 1.25 hr | 20 |
| 3" × 6" Al Panel | 4 mil | 3 hr | 1.75 hr | 1.25 hr | 41 |
| 3" × 6" Al Panel | 5 mil | 3 hr | 1.75 hr | 1.25 hr | 48 |
| 3" Si Wafer | 3 mil | 3 hr | 0.75 hr | 1.00 hr | 24 |
| 2" sq 10,000 A gold on nichrome | 3 mil | 3 hr | 0.75 hr | 1.00 hr | 22 |
| 2" sq wafer - Al coated | 6 mil | 3 hr | 0.75 hr | 1.00 hr | 42 |
| Al interdigitated pattern on 2" Si wafer | 6 mil | 3 hr | 0.75 hr | 1.00 hr | 22 |

The aluminum interdigitated pattern on the silicon wafer coated above was tested for porosity, pinhole density, and barrier layer ability by MIL STD 883C, Method 2021-3, Procedure B, for determining glassivation layer integrity with a phosphoric acid etch solution. The Etch solution consists of 16 parts conc. phosphoric acid, 2 parts deionized water, 1 part concentrated nitric acid and 1 part glacial acetic acid. The sample was tested by applying 1 drop of the etch solution on the surface of the coating for a period of 50 minutes (30 minutes=normal exposure time). The sample was next rinsed with distilled water and allowed to dry. Examination of the test area on the coating showed the film was intact and there was no evidence of any corrosion. The dielectric constant and dissipation factor for the 3"×6" aluminum panel coated above with the 41 micron thick coating are as follows:

| Frequency | Dielectric Constant | Dissipation Factor |
| --- | --- | --- |
| 100 HZ | 2.42 | 0.032 |
| 1 KHZ | 2.35 | 0.014 |
| 10 KHZ | 2.32 | 0.006 |
| 100 KHZ | 2.31 | 0.004 |

EXAMPLE 3

A coating composition was formed by mixing 0. 12 g Eccospheres SDT-28-27 (not crushed) , 0. 12 g plasma alumina, average particle size =6 microns (Product No. 13,699, ZYP Coatings, Inc. ), 0.7 g of Hydrogen silsesquioxane resin made by the method of Collins et al. in U.S. Pat. No. 3,615,273, 0. 012 g glycidoxypropyltrimethoxysilane and 0.456 g dodecane. The coating composition was applied to the surface of a 3"×5" aluminum panel using a 3 mil applicator. The coatings were allowed to dry for 3 hours at 64° C. The coated panels were then heated at 185° C. for 1 hour and at 400° C. for 1 hour. A 31 micron thick coating was obtained. The dielectric constant and dissipation factor for the coating are as follows:

| Frequency | Dielectric Constant | Dissipation Factor |
| --- | --- | --- |
| 100 HZ | 2.04 | 0.058 |
| 1 KHZ | 1.94 | 0.030 |
| 10 KHZ | 1.87 | 0.020 |
| 100 KHZ | 1.82 | 0.015 |

EXAMPLE 4

A coating composition was formed by mixing 0.15 g plasma alumina, average particle size=6 microns (Product No. 13,699, ZYP Coatings, Inc.), 0.7 g of Hydrogen silsesquioxane resin made by the method of Collins et al. in U.S. Pat. No. 3,615,273, 0.024 g glycidoxypropyltrimethoxysilane and 0.271 g dodecane. The coating composition was applied to the surface of a 3"×5" aluminum panel using a 2 mil applicator. The coatings were allowed to dry for 4 hours at 64° C. The coated panels were then heated at 185° C. for 1 hour and at 400° C. for 1 hour. A 36 micron thick coating was obtained. The dielectric constant and dissipation factor for the coating are as follows:

| Frequency | Dielectric Constant | Dissipation Factor |
| --- | --- | --- |
| 100 HZ | 2.23 | 0.038 |
| 1 KHZ | 2.15 | 0.017 |
| 10 KHZ | 2.12 | 0.008 |
| 100 KHZ | 2.10 | 0.005 |

EXAMPLE 5

Nalco 84SS-258 (30 % colloidal silica with a particle size of 20 nanometer diluted in a glycol propyl ether), 1.08 g, 0.6 g of Hydrogen silsesquioxane resin made by the method of Collins et al. in U.S. Pat. No. 3,615,273, and 1.08 g 2-(2-butoxyethoxy)ethyl acetate were mixed in 1.11 g methyl ethyl ketone. The coating composition was applied to the surface of 10 Motorola 14011B CMOS devices and spun at 3000 RPM for 10 seconds. A 1 inch square silicon wafer was also coated in the same manner. The coated materials were then heated at 400° C. for 2.5 hours in air. The CMOS devices were all functional after pyrolysis. Salt atmosphere tests per MIL-STD-883C, method 1009 showed that 7 out of 10 passed 2 hours and 3 of 7 passed 4 hours in the test. A similar coating of silica derived from H-resin failed after 10 minutes in the test.

EXAMPLE 6

Nalco 84SS-258 (30 % colloidal silica with a particle size of 20 nanometer diluted in a glycol propyl ether), 2.163 g, 2.0 g of triethoxysilane, 0.164 g water, 9.49 g isopropyl alcohol and 3.0 g n-butanol were mixed and heated at 60°-75° C. for 30 minutes. The coating composition was applied to the surface of 1×3 inch aluminum panel. The coated panel was air dried for 10 minutes and pyrolyzed at 400° C. for 1 hour in air. A Motorola 14011B CMOS device and a 1 inch square silicon wafer were also spin coated with the above liquid mixture at 3000 RPM for 15 seconds. The coated parts were then heated at 400° C. for 4 hours in air. FTIR showed essentially complete conversion to silica. The CMOS device was functional after pyrolysis and survived 4 hrs of the salt atmosphere tests of Example 5 (failed at 24 hrs).

EXAMPLE 7

Barium titanate, 3.0 g, 1.0 g of Hydrogen silsesquioxane resin made by the method of Collins et al. in U.S. Pat. No. 3,615,273, and 0.64 g glycidoxypropyltrimethoxysilane were mixed in 0.7 g xylene with a biohomogenizer for 4 minutes. The coating composition was applied to the surface of a 3"×6" aluminum panel with a 3 mil drawdown bar. The coated panel was then air dried for 2 hours and heated at 400° C. for 1 hours in air in a 12 inch Lindberg Box Furnace. The coating was 37±2 microns thick. Electrical data on the coating was as follows:

| Frequency | D.K. | D.F. |
| --- | --- | --- |
| $10^2$ | 18.5 | 0.033 |
| $10^3$ | 18.1 | 0.011 |
| $10^4$ | 17.9 | 0.008 |
| $10^5$ | 17.7 | 0.007 |
| $10^6$ | 17.5 | 0.007 |

EXAMPLE 8

Tantalum oxide ($Ta_2O_5$), 4.0 g, 1.0 g of Hydrogen silsesquioxane resin made by the method of Collins et al. in U.S. Pat. No. 3,615,273, and 0.3 g glycidoxypropyltrimethoxysilane were mixed in 1 g cyclic polydimethylsiloxanes with a biohomogenizer for 2.5 minutes. The coating composition was applied to the surface of a 3"×6" aluminum panel with a 3 mil drawdown bar. The coated panel was then air dried for 4 hours and heated at 500° C. for 1 hour in air in a 12 inch Lindberg Box Furnace. The coating was 32 microns thick. Upon examination at 1000X, the coating was found to have no cracks.

What is claimed is:

1. A method of forming a coating with a dielectric constant of at least 8 on a substrate comprising:
    applying a coating composition comprising hydrogen silsesquioxane resin and about 5 to about 90 weight percent of a filler having a dielectric constant of at least 8 onto a substrate; and heating the coated substrate at a temperature sufficient to convert the coating composition into a ceramic coating having a dielectric constant of at least 8.

2. The method of claim 1 wherein the coating composition is applied to the substrate by a process which comprises coating the substrate with a liquid mixture comprising a solvent, the hydrogen silsesquioxane resin and the filler and then evaporating the solvent.

3. The method of claim 1 wherein the coated substrate is heated at a temperature in the range of between about 50° C. and about 800° C. for less than about 3 hours.

4. The method of claim 1 wherein the hydrogen silsesquioxane resin is fractionated such that at least 75% of the polymeric species have a molecular weight between about 1200 and about 100,000.

5. The method of claim 1 wherein the coating composition also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the coating contains 0.1 to 30 percent by weight modifying ceramic oxide.

6. The method of claim 1 wherein the coating composition also contains a platinum, rhodium or copper catalyst in an amount of between about 5 and about 500 ppm platinum, rhodium or copper based on the weight of hydrogen silsesquioxane resin.

7. The method of claim 1 wherein the coating composition also contains a material which modifies the surface of the filler.

8. The method of claim 1 wherein the coating composition also contains a suspending agent.

9. The method of claim 1 wherein the filler is in a form selected from the group consisting of powders, particles, and flakes.

10. The method of claim 1 wherein the filler is a titanate, niobate or tungstate salt of a metal.

11. The method of claim 1 wherein the filler is selected from the group consisting of titanate, niobate or tungstate salts of strontium, zirconium, barium, lead, iron, zinc, and magnesium.

12. The method of claim 1 wherein the filler is selected from the group consisting of tantalum oxide, titanium oxide and niobium oxide.

13. The substrate coated by the method of claim 1.

14. A coating composition comprising hydrogen silsesquioxane resin and about 5 to about 90 weight percent of a filler having a dielectric constant of at least 8 diluted in a solvent.

15. The composition of claim 14 wherein the filler is a titanate, niobate or tungstate salt of a metal.

16. The composition of claim 14 wherein the filler is selected from the group consisting of titanate, niobate or tungstate salts of strontium, zirconium, barium, lead, iron, zinc, and magnesium.

17. The composition of claim 14 wherein the filler is selected from the group consisting of tantalum oxide, titanium oxide and niobium oxide.

* * * * *